United States Patent
Braun et al.

(10) Patent No.: US 6,480,044 B2
(45) Date of Patent: Nov. 12, 2002

(54) SEMICONDUCTOR CIRCUIT CONFIGURATION

(75) Inventors: Georg Braun, München (DE); Heinz Hönigschmid, East Fishkill, NY (US); Kurt Hoffmann, Taufkirchen; Oskar Kowarik, Neubiberg, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/804,322

(22) Filed: Mar. 12, 2001

(65) Prior Publication Data

US 2001/0028090 A1 Oct. 11, 2001

Related U.S. Application Data

(63) Continuation of application No. PCT/DE99/02831, filed on Sep. 7, 1999.

(30) Foreign Application Priority Data

Sep. 10, 1998 (DE) .......................................... 198 41 445

(51) Int. Cl.[7] .................................................. H03K 3/00
(52) U.S. Cl. ....................................... 327/112; 327/427
(58) Field of Search ............................. 327/333, 112, 327/111, 108, 109, 427, 434, 437; 326/85, 87

(56) References Cited

U.S. PATENT DOCUMENTS 5,602,797 A    2/1997  Kang ..................... 365/230.06
5,900,752 A  * 5/1999  Mar ............................ 327/111
6,337,587 B2 * 1/2002  Kruecke ..................... 327/112

FOREIGN PATENT DOCUMENTS

| DE | 197 06 537 A1 | 8/1998 |
| EP | 0 522 579 A2 | 1/1993 |
| EP | 0 559 995 A1 | 9/1993 |
| EP | 0 649 146 A1 | 4/1995 |
| EP | 0 801 396 A2 | 10/1997 |

* cited by examiner

Primary Examiner—Toan Tran
(74) Attorney, Agent, or Firm—Laurence A. Greenberg; Werner H. Stemer; Ralph E. Locher

(57) ABSTRACT

A semiconductor circuit is disclosed which contains a driving circuit which is integrated into a semiconductor substrate of a first conductivity type and includes positive voltage switching transistors for switching positive and/or zero voltage levels and negative switching transistors for switching negative and/or zero voltage levels. In addition, the driving circuit contains a control circuit which is positioned upstream from the driving circuit and is also embodied in the semiconductor substrate, which is connected to a substrate voltage. A negative voltage switching transistor of the driving circuit is configured inside an outer well which is embedded in the semiconductor substrate and is of a second conductivity type which is opposite to the first, and the outer well is connected to a supply voltage.

15 Claims, 4 Drawing Sheets

SEMICONDUCTOR CIRCUIT CONFIGURATION

CROSS-REFERENCE TO RELATED APPLICATION

This application is a continuation of copending International Application No. PCT/DE99/02831, filed Sep. 7, 1999, which designated the United States.

BACKGROUND OF THE INVENTION

1. Field of the Invention

The invention relates to a semiconductor circuit configuration having a driver circuit which is integrated in a semiconductor substrate of a first conductivity type and contains PV switching transistors for switching positive and zero-value voltage levels. The circuit configuration further has NV switching transistors for switching negative and zero-value voltage levels, and an actuation circuit which is positioned upstream of the driver circuit and is likewise formed in the semiconductor substrate with the semiconductor substrate being connected to a substrate level. The invention furthermore relates to a semiconductor circuit having an inversion and level-changing circuit.

Semiconductor circuit configurations and circuits of this generic type are used in particular as word line decoders for electrically erasable read only memories. The already known word line decoders can only apply two voltages to a downstream cell array at the same time, for example in the case of EEPROMs, the decoder switches between zero and +2.5 volts, for example, during reading or between zero volts and the programming voltage (for example −12 volts) during programming. In certain circumstances, it may be desirable to use a word line decoder to simultaneously apply either a zero level for lines which have not been selected, a positive voltage (for example the supply voltage) and a negative voltage to different signal lines (word lines) at the same time, for selective complementary line pairs. One example of this is the actuation of the word lines in a cell array having ferroelectric cells.

Published, European Patent Application EP 0 522 579 A1 discloses a driver circuit for EEPROM memories, in which "floating gate" transistors are used. In which all source and drain connections of all the transistors in an entire column of the memory array are switched on at the same time by a "source-column" decoder. The driver circuit formed in the line selection circuit is used for simultaneous selection of all the transistors in one line of the memory cell array. In this case, the transistor that switches negative voltages is formed in an additional well.

SUMMARY OF THE INVENTION

It is accordingly an object of the invention to provide a semiconductor circuit configuration that overcomes the above-mentioned disadvantages of the prior art devices of this general type, which can simultaneously produce a zero level, a positive voltage and a negative voltage.

With the foregoing and other objects in view there is provided, in accordance with the invention, a semiconductor circuit configuration. The circuit configuration includes a semiconductor substrate of a first conductivity type, a first line, a second line, a first individual line, a second individual line, and a substrate level connected to the semiconductor substrate. A driver circuit is integrated in the semiconductor substrate and contains a first and a second positive voltage (PV) switching transistor for switching positive and zero-value voltage levels, and a first and a second negative voltage (NV) switching transistor for switching negative and the zero-value voltage levels. The first PV switching transistor is connected between the first line and the first individual line. The first NV switching transistor is connected between the substrate level and the first individual line, the second NV switching transistor is connected between the second line and the second individual line. The second PV switching transistor is connected between the substrate level and the second individual line. The driver circuit has a number of circuit stages including a stage having an inversion and level-changing circuit. The driver circuit has outputs formed by at least one activation line pair formed of two complementary lines being the first individual line and the second individual line. The first PV switching transistor and the first NV switching transistor are able to connect a first activation voltage present on the first line to the first individual line. The second PV switching transistor and the second NV switching transistor at a same time are able to connect a second activation voltage present on the second line to the second individual line. The first activation voltage and the second activation voltage can be of opposite polarity. The first PV switching transistor and the first NV switching transistor are able to connect the first individual line to the substrate level. The second PV switching transistor and the second NV switching transistor at a same time are able to connect the second individual line to the substrate level. An outer well is disposed in the semiconductor substrate and is formed of a second conductivity type being opposite to the first conductivity type. The first NV switching transistor and the second NV switching transistor of the driver circuit are formed within the outer well, and the is outer well connected to a supply voltage. An actuation circuit is disposed upstream of and connected to the driver circuit and formed in the semiconductor substrate.

The invention provides for the driver circuit to contain a number of circuit stages and for the first stage of the driver circuit to have a first inversion and level-changing circuit. The NV switching transistor of the driver circuit is formed within the outer well, which is embedded in the semiconductor substrate, of a second conductivity type, which is the opposite to the first conductivity type, and the outer well is connected to a supply voltage.

When using conventional CMOS technology, parasitic diodes occur when switching negative voltages in the NMOS transistors, and these result in leakage currents. The invention thus proposes that the driver which follows the actuation circuit, or at least circuit groups or transistors of such a driver, be moved into the outer well. The well is in this case of the opposite conductivity type of the substrate, and is connected to the supply voltage. The advantage of the semiconductor circuit configuration is that the parasitic diodes of the NMOS transistors that are embedded in the outer well can now no longer conduct. The negative voltage which is applied to the well of the NMOS transistors and is to be switched can, in consequence, no longer have any disadvantageous effect on the rest of the circuit that is located on the substrate.

In one particularly preferred embodiment of the invention, the actuation circuit is formed by a decoder having a number of outputs coupled to the driver circuit. It is also advantageous for that output of the decoder which is switched to be active to supply a zero level, and all the other outputs, which are switched to be passive, each to supply a positive potential level in this case.

According to the invention, the outputs of the driver circuit are formed by at least one activation line pair. The activation line pairs, which are formed from complementary individual lines, then carry a zero level on both lines or, in the active state, positive and negative activation voltages, which are connected to the activation line pairs by activation switches following the first inversion and level-changing circuit. The invention also allows a number of activation line pairs to be connected to the positive and negative activation voltages at the same time. In this case, the polarity of potentials on the complementary lines can be interchanged by a selection circuit, which is upstream of the activation switches and defines the activation voltages to be switched through.

The potential of the positive activation voltage can also advantageously be greater than the potential of the supply voltage. In consequence, it is advantageous for the first inversion and level-changing circuit and the activation switches which connect the positive and negative activation voltage to the activation line pairs each to have a protection transistor of a predefined conductivity (NMOS) connected in between. A control connection of the transistor is connected to the supply voltage, a first an electrode connection is connected to the first inversion and level-changing circuit, and a second electrode connection is connected to the control connections of the activation switches.

In a further advantageous embodiment of the invention, the first inversion and level-changing circuit is followed by a second inversion and level-changing circuit, which is connected to the control connections of two deactivation switches, which connect the activation lines to the substrate level. In this case as well, it is possible to switch a number of pairs of complementary lines at the same time.

Protection transistors of a predefined conductivity type are provided. A first protection transistor has a control terminal connected to the supply voltage and electrode terminals connected to the first inversion and level-changing circuit and to the first PV switching transistor. A second protection transistor has a control terminal connected to the supply voltage and electrode terminals connected to the first inversion and level-changing circuit and to the second NV switching transistor.

In one preferred embodiment of the invention, it is possible for the first inversion and level-changing circuit to have an associated holding transistor, for example by a MOS transistor of the positive conductivity type. A control input of the holding transistor is connected to the output of the first inversion and level-changing circuit and whose electrode connections are connected first to the supply voltage and second to the input of the inversion and level-changing circuit. The advantage of the holding transistor is that it supports the high level of the input, thus allowing a standard 1-of-$2^N$—NAND decoder to be used.

In accordance with an added feature of the invention, the inversion and level-changing circuit, the further inversion and level, the protection transistors, the first PV switching transistor, the second PV switching transistor, the first NV switching transistor, the second NV switching transistor and the holding transistor are embedded within the outer well in the semiconductor substrate.

A further refinement of the invention provides for at least one of the inversion and level-changing circuit configurations to be provided with two transistors of opposite polarity. The transistors are integrated in the semiconductor substrate of the first conductivity type, with at least the transistor of the negative type being formed within the outer well. The outer well is embedded in the semiconductor substrate, with a conductivity type which is the opposite of the conductivity type of the first semiconductor substrate, and with the outer well being connected to the supply voltage. The circuit furthermore has a signal input, which is connected to the control inputs of the transistors of opposite polarity, and a signal output that is connected to a respective electrode connection of the transistors. The two remaining electrode connections of the transistors of opposite polarity are connected first, in the case of the positive type, to the positive supply voltage and, in the case of the negative type, to a negative voltage.

It is furthermore advantageous for at least one of the inversion and level-changing circuit configurations which are formed in a semiconductor substrate to have a signal input which is connected to the control input of a first transistor of the negative type. One of whose electrodes is connected to the negative supply voltage, while its other electrode is connected to the signal output of the circuit configuration. Furthermore, one electrode of a transistor of the positive type is connected to the signal output, while its other electrode is connected to the positive supply voltage and its control input is connected to the signal input of the circuit configuration. Furthermore, an electrode of a further transistor of the negative type is connected to the signal input, while its other electrode is connected to the negative supply voltage and its control input is connected to the signal output. In this case, the transistors of the negative type are formed within the outer well, which is embedded in the semiconductor substrate, of a second conductivity type which is of the opposite type to the semiconductor substrate. The outer well is expediently connected to a supply voltage.

Based on the principle of the invention, a transistor of the positive type is connected upstream of the signal input of the inversion and level-changing circuit. A control input of the transistor is connected to a zero potential, while its electrode connections are connected first to the input signal and second to the signal input of the inversion and level-changing circuit.

Other features which are considered as characteristic for the invention are set forth in the appended claims.

Although the invention is illustrated and described herein as embodied in a semiconductor circuit configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
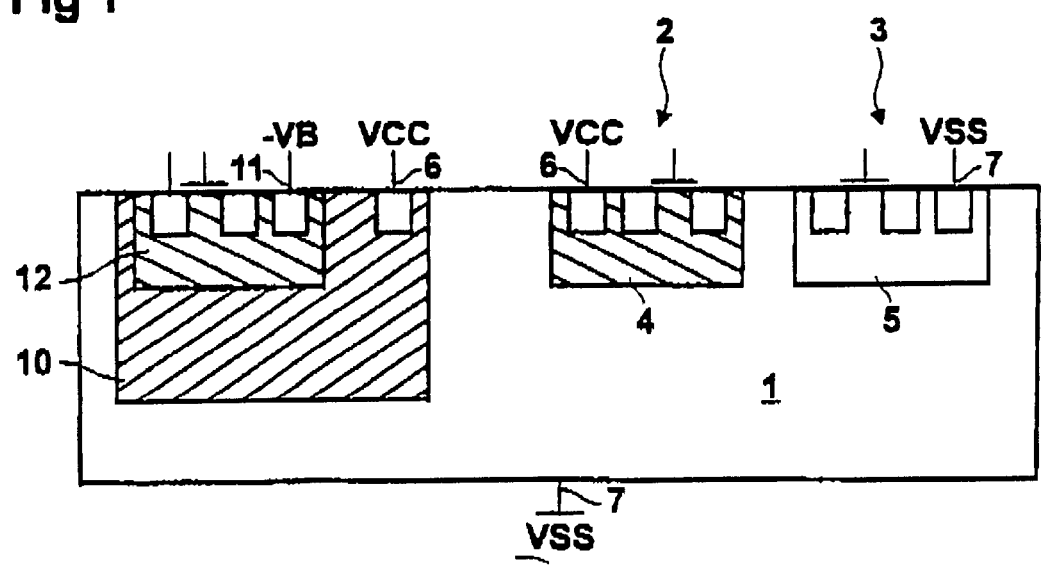
FIG. 1 is a diagrammatic, sectional view of a semiconductor structure formed in a substrate according to the invention.

In all the figures of the drawing, sub-features and integral parts that correspond to one another bear the same reference symbol in each case. Referring now to the figures of the drawing in detail and first, particularly, to FIG. 1 thereof, there is shown a section through a semiconductor structure having positive voltage (PV) and negative voltage (NV) switching transistors 2 and 3 formed in a p-conductive substrate 1. The PV switching transistors 2 are connected to an n-conductive well 4 which is incorporated in the substrate 1 and is connected to a supply voltage 6. The NV switching transistors 3 have a p-conductive well 5, which is incorporated in the substrate 1 and is connected to a substrate level 7. An NV switching transistor 12, for switching negative switching voltages 11, is formed in an additional outer well 10, of an opposite conductivity type to that of the substrate 1. The outer well 10 is connected to the supply voltage 6. This prevents any current from flowing between the potential 11 (−VB) and the substrate connection (VSS).

Figure 2:
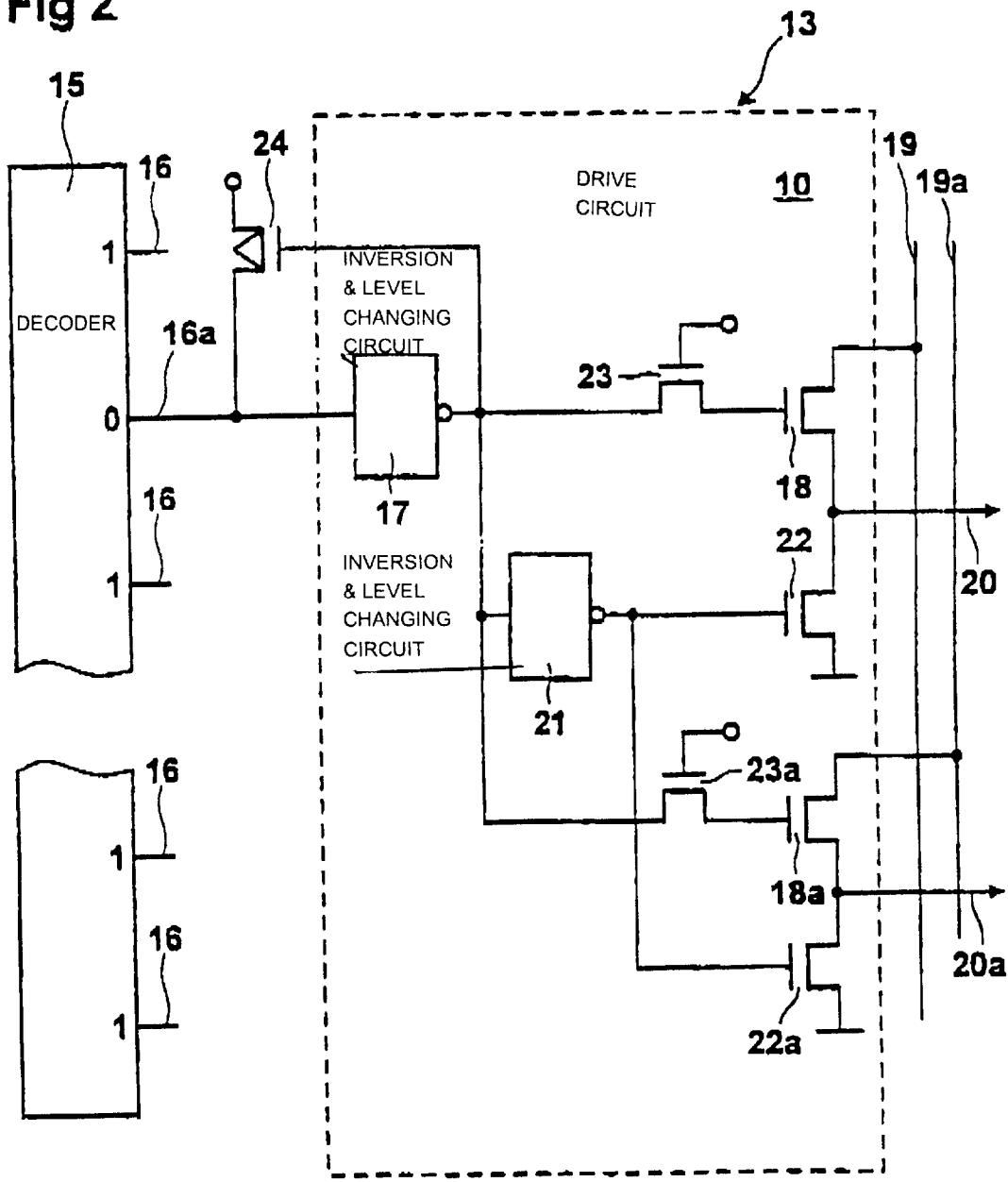
FIG. 2 is a block circuit diagram of a semiconductor circuit configuration according to a first exemplary embodiment of the invention.

FIG. 2 shows a schematic circuit diagram of a word line decoder according to the invention. An actuation circuit in the form of a standard 1-of-$2^N$—NAND decoder 15 with outputs 16 and 16a is followed by a driver circuit 13. On the outputs 16, the active output 16a in this example is followed by an inversion and level changing-circuit 17, which inverts and additionally changes the level of its input signal. Via activation switches 18 and 18a, the inversion and level changing circuit 17 connects the activation voltages, which are applied to the lines 19 and 19a, to a complementary activation line pair 20 and 20a. The neutral connection of the activation line pair to zero is ensured by a further inversion and level-changing circuit 21, which follows the first inversion and level-changing circuit 17, and is followed by two deactivation switches 22 and 22a which connect the substrate level to the activation line pair 20 and 20a when the output 16a of the decoder 15 is switched to be passive ("high"). The first inversion and level-changing circuit 17 and the activation switches 18 and 18a are followed by protection transistors 23 and 23a, whose control connections are connected to the supply voltage and whose electrodes are respectively connected to the inversion and level-changing circuit 17 and to the activation switch 18, 18a. The protection transistors 23, 23a ensure that a voltage that is higher than the supply voltage can be applied to the line 19 or 19a without this causing any reactions on the upstream circuit. In order to prevent any unnecessary load on the outputs 16 and 16a of the NAND decoder 15, a holding transistor 24 (for example a PMOS transistor) is positioned upstream of the first inversion and level changing circuit 17. A control input of the holding transistor 24 is connected to the output of the inversion and level-changing circuit 17, one of its electrodes is connected to the input of the inversion and level-changing circuit 17, and its other electrode is connected to the supply voltage. According to the invention, the entire circuit part formed by the driver 13 following the decoder 15 is embedded in the outer well 10 formed in the substrate 1, in order that the processes of switching the negative and positive activation voltages which are applied to the lines 19 and 19a can have no negative effect on the decoder 15, which is formed on the same substrate, or on other circuit parts by changing the operating points of the transistors or by leakage currents within them. To this end, the outer well 10 is connected to the supply voltage. The complementary activation line pair 20 and 20a on the output side can, by virtue of the teaching according to the invention, respectively have a positive and negative voltage, or the zero level, applied to them.

Figure 3:
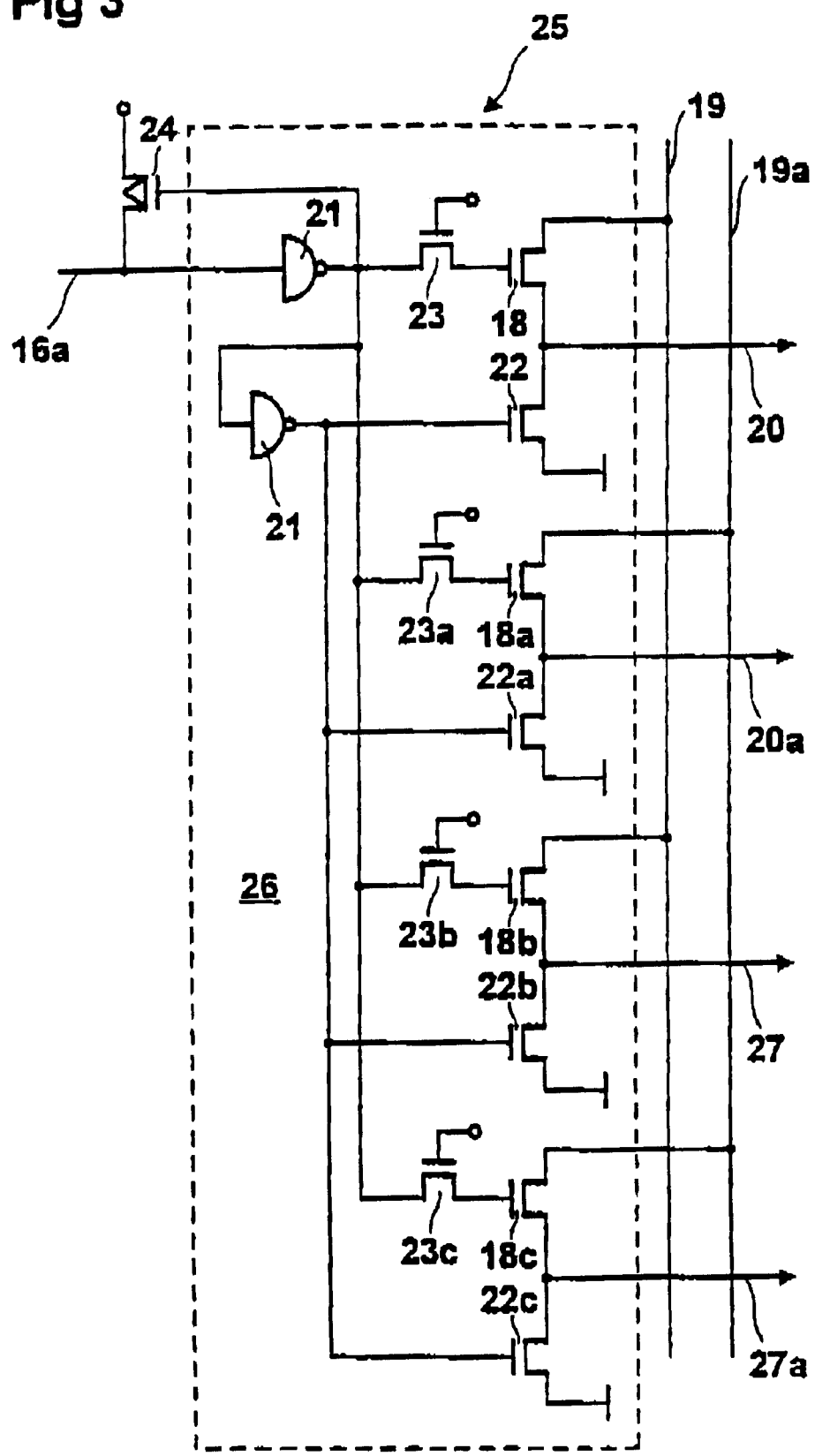
FIG. 3 is a circuit diagram of the semiconductor circuit configuration according to a second exemplary embodiment of the invention.

FIG. 3 shows a circuit proposal in which a second activation line pair 27 and 27a having activation switches (18b and 18c), deactivation switches (22b and 22c) and protection transistors (23b and 23c) is driven in addition to the first (20 and 20a). In this case, the entire driver circuit 25 is formed within an outer well 26, which is connected to the supply voltage. This idea allows more than two activation line pairs to be provided.

Figure 4:
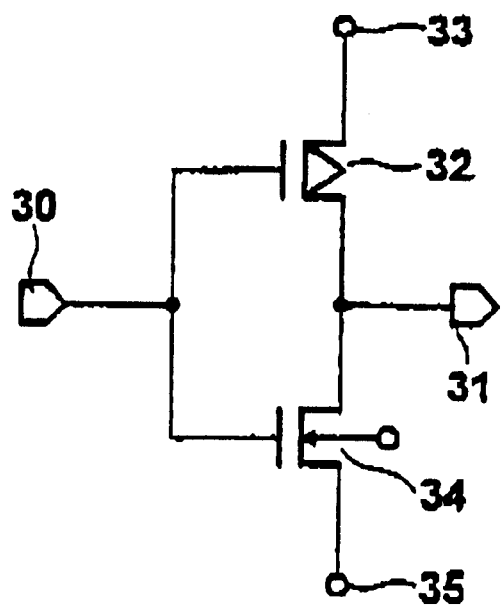
FIG. 4 is a circuit diagram of an inversion and level changing circuit.

FIG. 4 shows an inversion and level-changing circuit configuration according to the invention. The inversion and level-changing circuit has an input 30, an output 31 and a transistor pair of opposite polarities. One electrode of a transistor 32 of a positive conductivity type is connected to a supply voltage 33, its other electrode is connected to the output 31, and its control input is connected to the input 30. One electrode of a transistor 34 of a negative conductivity type is connected to a negative supply voltage 35, its control input is connected to the input 30, and its other electrode is connected to the output 31 of the circuit configuration.

The outer well, which contains at least the transistor 34 for switching the negative supply voltage, is provided in the semiconductor substrate 1 and is of the opposite polarity type to that of the substrate. According to the invention, the circuit configuration inverts and changes the level of the level which is applied to the input 30 and whose value is zero or positive. If the input signal value is positive, the signal is changed to the value of the negative supply voltage, and if its level is zero, it is changed to the value of the positive supply voltage.

Figure 5:
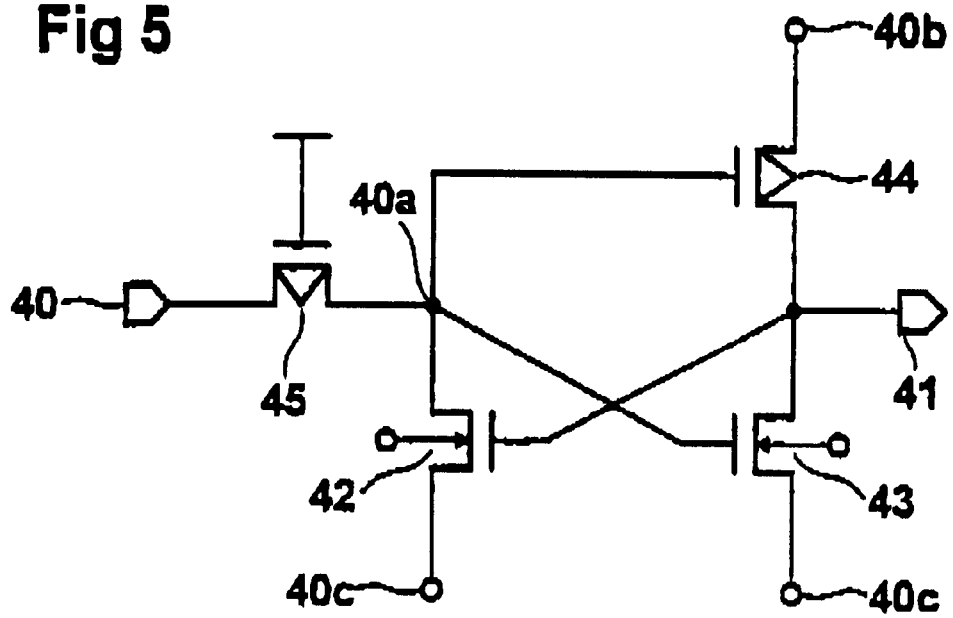
FIG. 5 is a circuit diagram of a further exemplary embodiment of the inversion and level changing circuit.

FIG. 5 shows a further refinement of the inversion and level-changing circuit configuration, in which the entire circuit is formed within the substrate 1. The inversion and level-changing circuit configuration has at least two transistors 42, 43 of the negative type formed within the outer well of the opposite conductivity type to that of the substrate. The two transistors 42 and 43 of the negative type are assigned to an input 40a of the circuit configuration, and one of their electrodes is in each case connected to the negative supply voltage. A control input of the negative transistor 42 on the input side is in this case connected to the output 41, and the control input of the negative transistor 43 on the output side is connected to the input 40a. One electrode of a transistor 44 of the positive type is connected to the positive supply voltage, and its other electrode is connected to the output 41 of the circuit configuration. The control input of the transistor 44 is in this case connected to the input 40a. A PMOS transistor 45 is in this case provided upstream of the input of the inversion and level-changing stage and makes it impossible for the negative supply voltage of the circuit configuration to be transferred to an input 40. Its control input is thus connected to the zero level.

The substrate that contains the circuit has the outer well which contains at least the transistors 42 and 43 for switching the negative supply voltage and whose polarity type is opposite to that of the substrate.

According to the invention, the circuit configuration inverts and changes the level of the level which is applied to the input 40, and which is zero or has a positive value. If the input signal value is positive, the signal is changed into the value of the negative supply voltage, and if its value is zero, it is changed to the positive supply voltage.

We claim:

1. A semiconductor circuit configuration, comprising:
    a semiconductor substrate of a first conductivity type;
    a first line and a second line;
    a first individual line and a second individual line;

a substrate level connected to said semiconductor substrate;

a driver circuit integrated in said semiconductor substrate and containing a first and a second positive voltage (PV) switching transistor for switching positive and zero-value voltage levels, and a first and a second negative voltage (NV) switching transistor for switching negative and the zero-value voltage levels, said first PV switching transistor connected between said first line and said first individual line, said first NV switching transistor connected between said substrate level and said first individual line, said second NV switching transistor connected between said second line and said second individual line, said second PV switching transistor connected between said substrate level and said second individual line, said driver circuit having a number of circuit stages including a first stage having a first inversion and level-changing circuit, and a second stage having a second inversion and level-changing circuit following said first inversion and level-changing circuit, said driver circuit having outputs formed by at least one activation line pair formed of two complementary lines being said first individual line and said second individual line;

said first PV switching transistor and said first NV switching transistor able to connect a first activation voltage present on said first line to said first individual line, said second PV switching transistor and said second NV switching transistor at a same time able to connect a second activation voltage present on said second line to said second individual line, the first activation voltage and the second activation voltage can be of opposite polarity;

said first PV switching transistor and said first NV switching transistor able to connect said first individual line to said substrate level, said second PV switching transistor and said second NV switching transistor at a same time able to connect said second individual line to said substrate level;

an outer well disposed in said semiconductor substrate and formed of a second conductivity type being opposite to paid first conductivity type, said first NV switching transistor and said second NV switching transistor of said driver circuit formed within said outer well, said outer well connected to a supply voltage;

an actuation circuit disposed upstream of and connected to said driver circuit and formed in said semiconductor substrate; and said first NV switching transistor and said second PV switching transistor each having a control terminal connected to said second inversion and level-changing circuit and each having electrode connections connected to said substrate level and to said two complementary individual lines.

2. The semiconductor circuit configuration according to claim 1, wherein said actuation circuit is formed by a decoder having a number of outputs which are coupled to said driver circuit.

3. The semiconductor circuit configuration according to claim 2, wherein one of said outputs of said decoder is able to be switched to be active and supplies a zero level voltage, while all others of said outputs of said decoder, which are switched to be passive, each supply a positive potential level voltage.

4. The semiconductor circuit configuration according to claim 3, wherein said first inversion and level-changing circuit is followed by and connected to said first PV switching transistor and said second NV switching transistor, which switch a negative activation voltage, which is applied to said driver circuit, to at least said first individual line of said at least one activation line pair, and switch a positive activation voltage, which is likewise applied to said driver circuit, to said second individual line of said at least one activation line pair, respectively.

5. The semiconductor circuit configuration according to claim 4, wherein a potential of the positive activation voltage is equal to or greater than a potential of the supply voltage.

6. The semiconductor circuit configuration according to claim 1,
wherein said first inversion and level-changing circuit and said first PV switching transistor together with said second NV switching transistor switch the first activation voltage and the second activation voltage; and
including protection transistors of a predefined conductivity type, a first of said protection transistors having a control terminal connected to the supply voltage and electrode terminals connected to said first inversion and level-changing circuit and to said first PV switching transistor, a second of said protection transistors having a control terminal connected to the supply voltage and electrode terminals connected to said first inversion and level-changing circuit and to said second NV switching transistor.

7. The semiconductor circuit configuration according to claim 6, including a holding transistor having a control terminal connected to an output of said first inversion and level-changing circuit and electrode terminals connected to the supply voltage and to an input of said first inversion and level-changing circuit.

8. The semiconductor circuit configuration according to claim 7, wherein said holding transistor is a MOS transistor having a positive conductivity type.

9. The semiconductor circuit configuration according to claim 6, wherein said first inversion and level-changing circuit, said second inversion and level, said protection transistors, said first PV switching transistor, said second PV switching transistor, said first NV switching transistor and said second NV switching transistor are embedded within said outer well in said semiconductor substrate.

10. The semiconductor circuit configuration according to claim 7, wherein said holding transistor is embedded within said outer well.

11. The semiconductor circuit configuration according to claim 1, wherein at least one of said first inversion and level-changing circuit and said second inversion level-changing circuit is formed of two transistors of opposite polarity integrated in said semiconductor substrate, a signal input connected to said two transistors, and a signal output connected to said two transistors.

12. The semiconductor circuit configuration according to claim 11, wherein said two transistors have control inputs connected to said signal input, one of said two transistors is a positive type transistor having a first electrode connected to a positive supply voltage and a second electrode connected to said output, another of said two transistors is a negative type transistor having a first electrode connected to said output and a second electrode connected to a negative voltage, said negative type transistor is formed within said outer well and said outer well is connected to the supply voltage.

13. The semiconductor circuit configuration according to claim 1, wherein at least one of said first inversion and level-changing circuit and said second inversion level-changing circuit is formed of transistors, including positive type transistors and negative type transistors integrated in said semiconductor substrate, a first input connected to said transistors, a second input connected to said transistors, and an output connected to said transistors.

14. The semiconductor circuit configuration according to claim 13, wherein:

a first negative type transistor of said negative type transistors has a control input connected to said first input, a first electrode connected to a negative supply voltage, and a second electrode connected to said output;

one of said positive type transistors has a first electrode connected to said output, a second electrode connected to a positive supply voltage, and a control input connected to said first input; and a second negative type transistor of said negative type transistor has a first electrode connected to said control input of said one of said positive type transistors, a second electrode connected to the negative supply voltage, and a control input connected to said output, said negative type transistors are formed within said outer well and said outer well is connected to the supply voltage.

15. The semiconductor circuit configuration according to claim 14, wherein another transistor of said positive type transistors is connected upstream of said first input and has a control input connected to a zero potential voltage, a first electrode connected to said second input and a second electrode connected to said first input.

* * * * *